US010879030B2

(12) United States Patent
Welkie et al.

(10) Patent No.: US 10,879,030 B2
(45) Date of Patent: Dec. 29, 2020

(54) DYNAMIC ELECTRON IMPACT ION SOURCE

(71) Applicant: PerkinElmer Health Sciences, Inc., Waltham, MA (US)

(72) Inventors: David G. Welkie, Trumbull, CT (US); Tong Chen, Shelton, CT (US)

(73) Assignee: PerkinElmer Health Sciences, Inc., Waltham, MA (US)

( * ) Notice: Subject to any disclaimer, the term of this patent is extended or adjusted under 35 U.S.C. 154(b) by 279 days.

(21) Appl. No.: 16/033,927

(22) Filed: Jul. 12, 2018

(65) Prior Publication Data
US 2020/0020502 A1 Jan. 16, 2020

(51) Int. Cl.
*H01J 37/08* (2006.01)
*H01J 27/02* (2006.01)
*H01J 37/30* (2006.01)

(52) U.S. Cl.
CPC ............ *H01J 37/08* (2013.01); *H01J 27/022* (2013.01); *H01J 37/3002* (2013.01); *H01J 2237/082* (2013.01)

(58) Field of Classification Search
CPC ...... H01J 37/08; H01J 37/3002; H01J 27/022; H01J 27/205; H01J 2237/082; H01J 49/20; H01J 49/22; H01J 49/14; H01J 49/062; H01J 49/147
See application file for complete search history.

(56) References Cited

U.S. PATENT DOCUMENTS

| 3,461,285 A | 8/1969 | Werner |
| 4,206,383 A * | 6/1980 | Anicich ............... H01J 27/205 250/427 |
| 5,850,084 A * | 12/1998 | Holkeboer .......... H01J 49/0013 250/423 R |
| 2007/0187592 A1 | 8/2007 | Geist et al. |

FOREIGN PATENT DOCUMENTS

| EP | 0329461 | 8/1989 |
| JP | 2002289131 | 10/2002 |
| WO | WO 2020/014571 | 1/2020 |

OTHER PUBLICATIONS

International Search Report and Written Opinion in corresponding Application No. PCT/US2019/041540, dated Nov. 12, 2019, pp. 1.
(Continued)

*Primary Examiner* — David E Smith
*Assistant Examiner* — Hsien C Tsai
(74) *Attorney, Agent, or Firm* — Fish & Richardson P.C.

(57) ABSTRACT

An ion source can include a magnetic field generator configured to generate a magnetic field in a direction parallel to a direction of the electron beam and coincident with the electron beam. However, this magnetic field can also influence the path of ionized sample constituents as they pass through and exit the ion source. An ion source can include an electric field generator to compensate for this effect. As an example, the electric field generator can be configured to generate an electric field within the ion source chamber, such that an additional force is imparted on the ionized sample constituents, opposite in direction and substantially equal in magnitude to the force imparted on the ionized sample constituents by the magnetic field.

18 Claims, 9 Drawing Sheets

(56) References Cited

OTHER PUBLICATIONS

J.E. Delmore, "A Crossed Electric-Magnetic Field Electron-Capture Ion Source," International Journal of Mass Spectrometry and Ion Physics, vol. 51, No. 2-3, 1983, pp. 191-205.

Prosser et al., "A novel magnetic sector mass spectrometer for isotope ratio determination of light gases," International Journal of Mass Spectrometry and Ion Processes, Elsevier Scientific Publishing Co., vol. 125, No. 2-3, 1993, pp. 241-266.

* cited by examiner

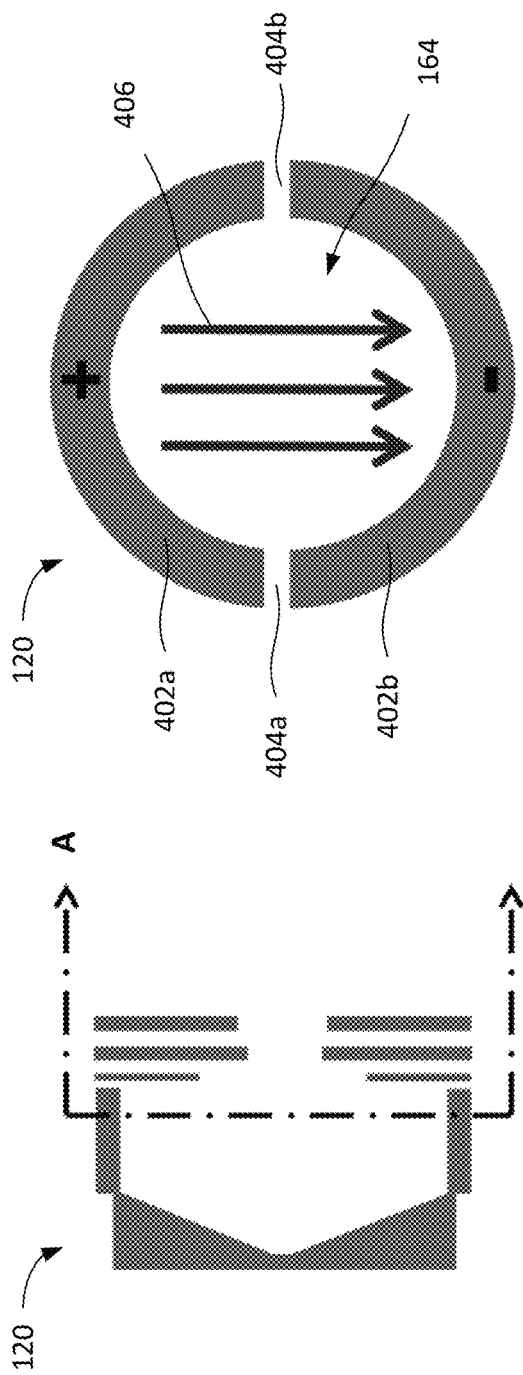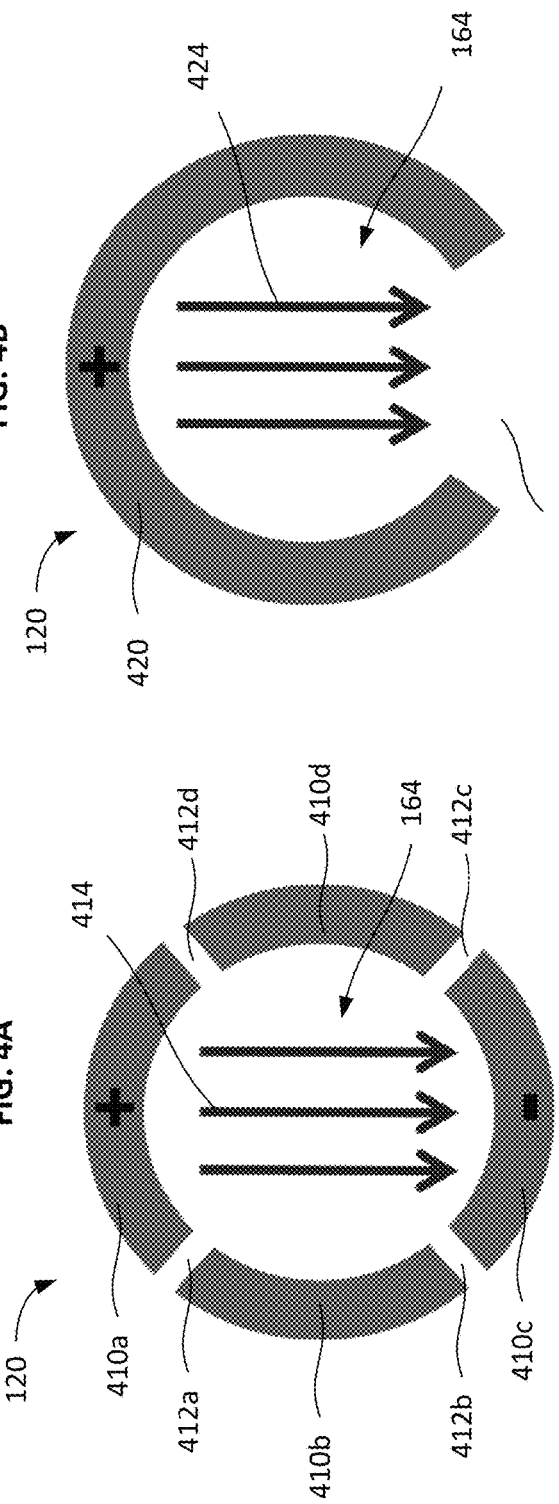

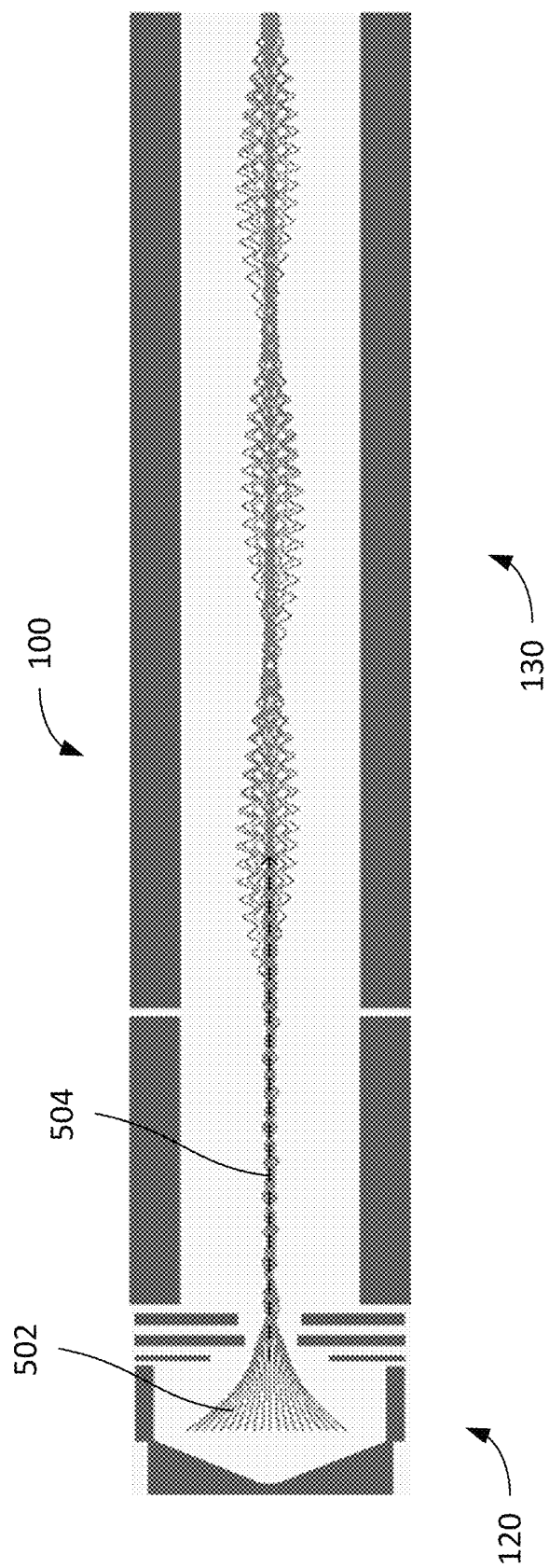

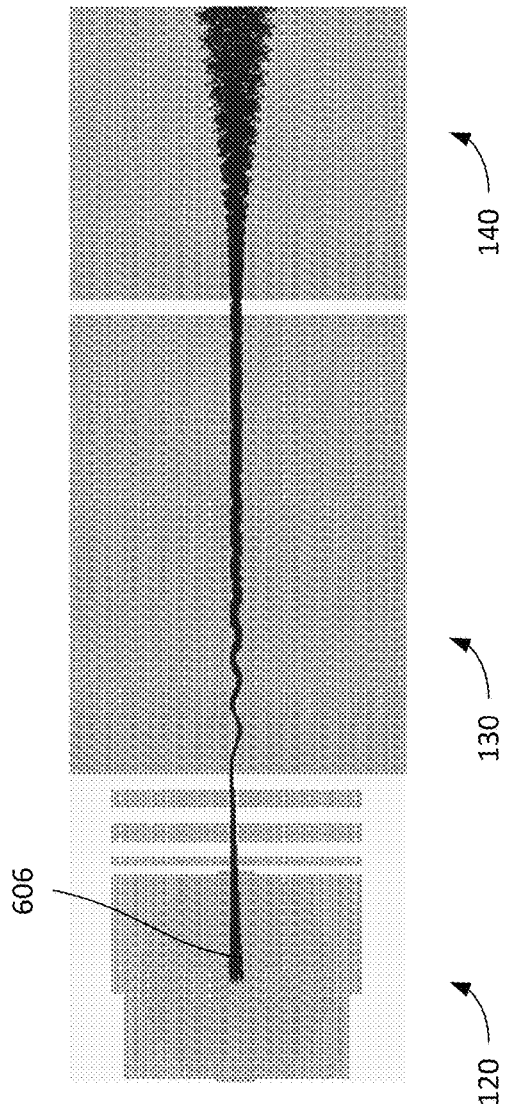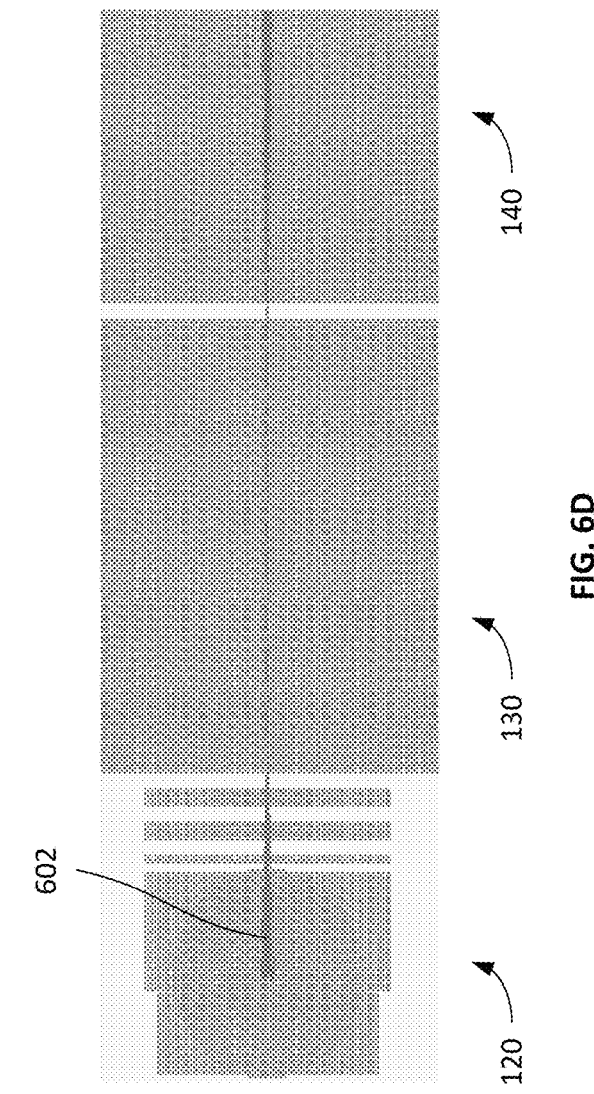

1

DYNAMIC ELECTRON IMPACT ION SOURCE

TECHNICAL FIELD

This disclosure relates to mass spectroscopy systems, and more particularly to transferring ionized sample constituents from an ion source to a mass analyzer.

BACKGROUND

Gas chromatography/mass spectrometry (GC/MS) is an analytical method that combines the features of gas-chromatography and mass spectrometry to identify different substances within a test sample.

In some GC/MS instruments, samples are separated into their constituents, then ionized by an ion source. The ionized sample constituents are then transferred to a downstream mass analyzer (e.g., a quadrupole mass filter) for examination. To improve the collection of ions, electrode lenses (e.g., direct current lenses) can be used to focus ions into a downstream transfer chamber and into the mass analyzer.

SUMMARY

This disclosure features systems and techniques for efficiently transferring ions from an ion source to a downstream mass analyzer entrance in the context of a mass spectrometry instrument.

In GC/MS instruments, a sample is separated into its constituents by a gas chromatograph. As an example, a capillary column can be used to separate sample constituents based on their relative retention within the column. Sample constituents eluted from the column are subsequently ionized, and the ionized sample constituents are analyzed by a mass analyzer.

Sample constituents can be ionized using an ion source. Example ion sources include electron ionization (EI) ion sources and chemical ionization (CI) ion sources.

As an example, an EI ion source can receive an inflow of eluted samples constituents from a gas chromatograph, and direct the sample constituents into an ionization region within the ion source. Further, the ion source can generate an electron beam through the ionization region, causing a portion of the eluted constituents to be ionized by interaction with the electrons in the electron beam. In turn, the ionized sample constituents are accelerated out of the ion source (e.g., using DC electrode lenses), and are directed to a downstream mass analyzer for analysis.

In general, the performance of the mass analyzer depends, at least in part, on the focus and angular spread of the received ionized sample constituents. In particular, the performance of the mass analyzer is improved when it receives a finely focused stream of ionized sample constituents having a low angular spread. Thus, to improve the performance of the GC/MS instrument, the ionized sample constituents should ideally exit the ion source chamber along a finely focused beam path, and with a low angular spread.

Further, in some cases, an ion source can include a magnetic field generator configured to generate a magnetic field in a direction parallel to a direction of the electron beam and coincident with the electron beam. This can be useful, for example, as it causes the electrons of the electron beam to travel in a helical direction about the direction of the electron beam. This lengthens the path of each electron within the ion source chamber, and increases the likelihood that each electron will interact with and ionize the sampled constituents. As a result, the efficiency of the ion source is improved.

However, this magnetic field can also influence the path of ionized sample constituents as they pass through and exit the ion source. For example, the magnetic field can impart a Lorentz force on the ionized sample constituents in a direction orthogonal to their direction of travel, causing them to deviate from their path. As a result, the ionized sample constituents may exit the ion source along a bent path and/or in a non-uniform or scattered manner, thereby negatively impacting the performance of the mass analyzer. Further, in some cases, the ionized sample constituents can collide with the chamber walls of the ion source, and might not exit the ion source chamber at all.

An ion source can include an electric field generator to compensate for this effect (e.g., by reducing or eliminating the effect of the magnetic field on the ionized sample constituents). As an example, the electric field generator can be configured to generate an electric field within the ion source chamber, such that an additional force is imparted on the ionized sample constituents. The force imparted on the ionized sample constituents by the electric field can be opposite in direction and substantially equal in magnitude to the force imparted on the ionized sample constituents by the magnetic field, such that the two forces substantially cancel one another. As a result, the ionized sample constituents are less likely to deviate or be scattered from a straight path, and thus exit the ion source chamber in a more focused manner.

In an aspect, a system includes an ion source chamber. The ion source chamber includes a first input port, a second input port different from the first input port, an exit port, a magnetic field generator configured to generate a magnetic field within the ion source chamber, a first electric field generator configured to generate a first electric field within the ion source chamber, and a second electric field generator configured to generate a second electric field within the ion source chamber. The ion source chamber is configured, during operation, to receive gas-phase neutral species through the first input port, receive a flow of electrons through the second input port, guide the electrons through the ion source chamber using the magnetic field generator, generate ions in an ionization region within the ion source chamber through an interaction between the gas-phase neutral species and the electron, focus and accelerate at least some of the ions from the ion source chamber through the exit port along an ion beam axis using the first electric field generator. The second electric field generator is configured to reduce or eliminate an influence of the magnetic field on at least some of the ions accelerated from the ion source.

Implementations of this aspect can include one or more of the following features.

In some implementations, the electrons can flow in a first transverse direction within the ion source chamber. The first transverse direction can be orthogonal to the ion beam axis The magnetic field generator can be configured to generate the magnetic field in the first transverse direction and coincident with the flow of electrons. The magnetic field generator can include at least two permanent magnets. The second electric field generator can be configured to generate the second electric field in a second transverse direction. The second traverse direction can be orthogonal to the first transverse direction and orthogonal to the ion beam axis.

In some implementations, focusing and accelerating at least some of the ions from the ion source chamber through the exit port can include applying, to each ion of a first subset of ions having a first m/z range, a first force using the first electric field generator to focus and accelerate the ions along the ion beam axis, whereby the first subset of ions experience a second force due to a motion of the first subset of ions in the magnetic field, the second force being orthogonal to both the ion beam axis and a direction of the magnetic field. Focusing and accelerating at least some of the ions from the ion source chamber through the exit port can also include applying, to each ion of the first subset of ions, a third force using the second electric field generator, and guiding the first subset of ions through the exit port. For each ion of the first subset of ions, the third force and second force can be opposite in direction and are substantially equal in magnitude. Focusing and accelerating at least some of the ions from the ion source chamber through the exit port can include applying, to each ion of a second subset of ions having a second m/z range different than the first m/z range, a fourth force using the first electric field generator, whereby the second subset of ions experience a fifth force due to a motion of the second subset of ions in the magnetic field, the fifth force being orthogonal to both the ion beam axis and the direction of the magnetic field. Focusing and accelerating at least some of the ions from the ion source chamber through the exit port can also include applying, to each ion of the second subset of ions, a sixth force using the second electric field generator. For each ion of the second subset of ions, a magnitude of the fifth force can be different than a magnitude of the sixth force.

In some implementations, the second electric field generator can include a first electrode disposed along a periphery of the ionization region. The second electric field generator can be configured to apply a first electric potential onto the first electrode to generate the second electric field. The second electric field generator can further include a second electrode disposed opposite the first electrode along the periphery of the ionization region. The second electric field generator can be configured to apply a second electric potential onto the second electrode to generate the second electric field. The system can further include one or more electrical elements disposed between the first electrode and the second electrode. The second electric field generator can be configured to apply a third electric potential onto the one or more electrical elements. The third electric potential can be an average of the first electric potential and the second electric potential. An inner contour of the first electrode and an inner contour of the second electrode can define, at least in part, a cross-sectional shape. The cross-sectional shape can be one of a polygon, an ellipse, a circle, a hyperbola, or a parabola.

In some implementations, the system can further include a mass analyzer. The mass analyzer can be configured to receive at least some of the ions from the ion source chamber through the exit port.

In some implementations, the first electric field generator can include an entrance electrode disposed proximate to the first input port. The first electric field generator can be configured to apply an electric potential onto the entrance electrode to generate the first electric field.

In some implementations, the first electric field generator can include an exit electrode disposed proximate to the exit port. The first electric field generator can be configured to apply an electric potential onto the exit electrode to generate the first electric field.

In another aspect, an ion source chamber of columnar geometry can include an entrance electrode assembly positioned at a first end of the chamber, an exit electrode assembly positioned at a second end of the chamber, a body electrode assembly positioned along the axis between the first end and the second end, encompassing a source volume where ions are generated. The ion source chamber can also include a first electric field generator configured to generate a first electric field in the first axial direction within the ion source chamber to focus and accelerate at least some of the analyte ions from the ion source chamber through the exit port, and a second electric field generator configured, during operation, to generate a second electric field in the first transverse direction being orthogonal to the axis within the ion source chamber, whereby the influence of the magnetic field on the motion of ions having a first m/z range accelerated from the ion source is reduced or eliminated. The ion source chamber can also include a first input port located on the entrance electrode assembly or body electrode assembly for importing electrons from the electron source, a second input port located on the entrance electrode assembly or body electrode assembly for importing at least one analyte, a magnet assembly configured for generating a dipolar magnetic field in the second transverse direction perpendicular to the axis and the first transverse direction, and an electron source configured for generating an electron beam which passes through the perforated ionization chamber in the second transverse direction coincident with the magnetic field with a portion of electron beam inside the chamber.

Implementations of this aspect can include one or more of the following features.

In some implementations, an inner surface of the entrance electrode assembly can be of a frusto-conical structure.

In some implementations, the body electrode assembly can be of hollow columnar structure. A cross-sectional shape of the body electrode on a transverse plane perpendicular to the axis can be one of a circle, a hyperbola, a parabola, a polygon. A cross-sectional shape of the body electrode on a transverse plane perpendicular to the axis can be either axial symmetric or axial asymmetric.

In another aspect, a system can include a control module, which in real-time varies respective DC voltages supplied to the entrance electrode assembly, the exit electrode assembly, and the body electrode assembly, so that the first m/z range in claim 16 can be scanning across the full mass range during operation.

The details of one or more embodiments are set forth in the accompanying drawings and the description below. Other features advantages will be apparent from the description and drawings, and from the claims.

DESCRIPTION OF DRAWINGS

FIG. 4A shows a cross-sectional view of an example ion source.

FIG. 4B-D show cross-section views of example configurations of an ion source.

FIG. 5 shows example trajectories of ionized sample constituents through an example ion source chamber.

FIG. 6A-6D shows example trajectories of ionized sample constituents through an example ion source chamber. FIGS. 6A and 6C show example trajectories of ionized sample constituents without compensation by an electric field.

FIGS. 6B and 6D show example trajectories of ionized sample constituents with compensation by an electric field.

DETAILED DESCRIPTION

Figure 1:
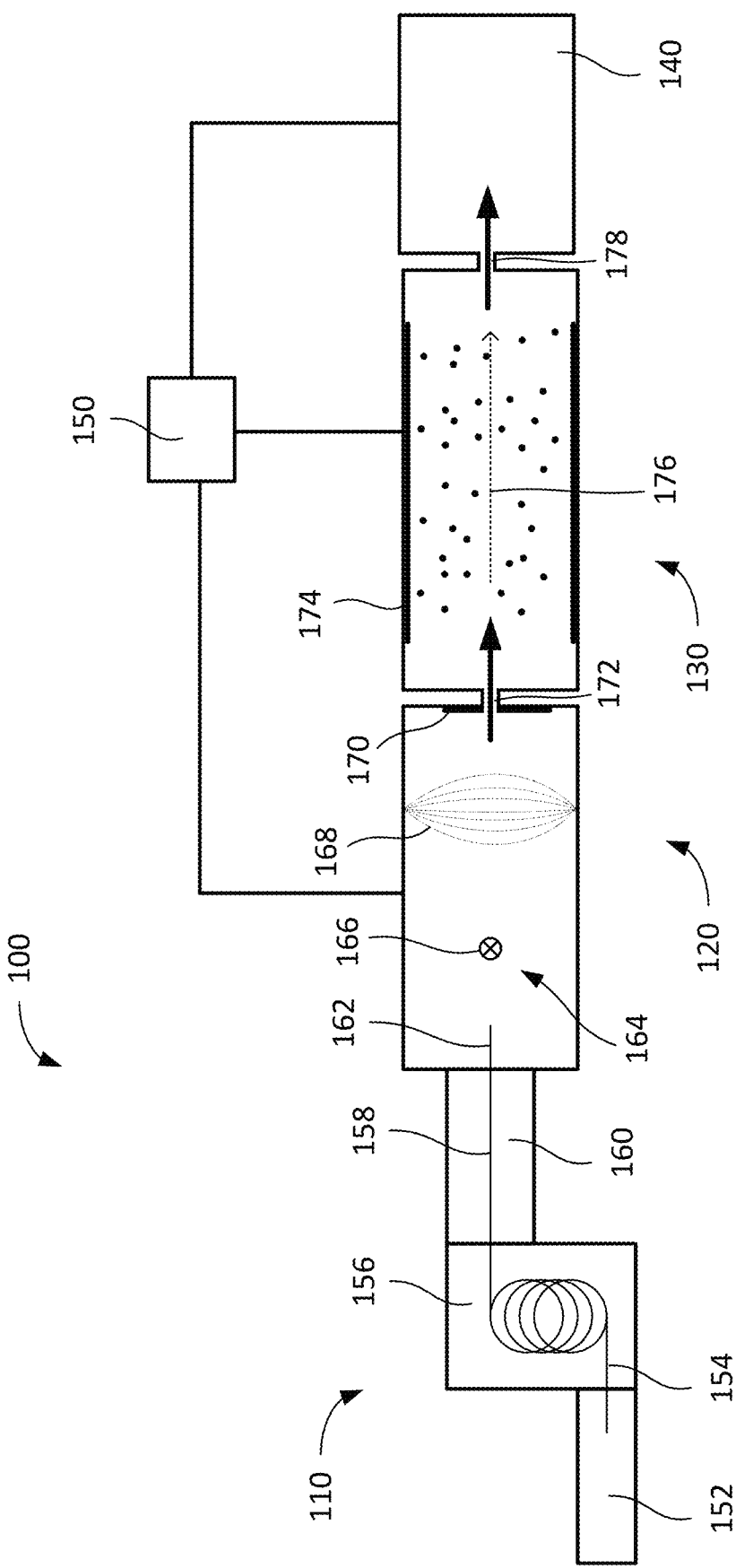
FIG. 1 is a schematic diagram of example gas chromatography/mass spectrometry (GC/MS) system.

A simplified schematic diagram of an example gas chromatography/mass spectrometry (GC/MS) system 100 is shown in FIG. 1. The system 100 includes a gas chromatograph 110, an ion source 120, an ion transfer chamber 130, a quadrupole mass analyzer 140, and a control module 150.

During operation of the system 100, samples are injected into an injector port 152 of the gas chromatograph 110, and enter into capillary column 154. The samples flow through the capillary column 154 and through a heated oven 156 with the help of a flow of helium gas. The samples are separated into their constituents according to their relative retention in the column 154. For example, the separation of sample constituents can depend on the column's dimensions (e.g., length, diameter, and film thickness), as well as its phase properties. The difference in the chemical properties between different molecules in the sample and their relative affinity for the stationary phase of the column promote separation of the molecules as the sample travels the length of the column.

The exit portion 158 of the column 154 passes through a heated transfer component 160, and terminates at a port 162 positioned within the ion source 120. Having been separated in the column 154, the sample constituents elute sequentially from the port 162 into the chamber of the ion source 120. In some cases, the sample constituents can include one or more gas-phase neutral species.

In some cases, the ion source 120 can be an electron ionization (EI) ion source. For example, as shown in FIG. 1, the ion source 120 can generate an electron beam 166 through the chamber of the ion source 120, causing a portion of the eluting constituents to be ionized by interaction with the electrons in the electron beam 166 within an ionization region 164 (e.g., a void area within the chamber of the ion source 120). In FIG. 1, the electron beam 166 is represented by a cross, indicating that the direction of the electron beam 166 is into the page. In some cases, the ionization can occur due to an interaction between the gas-phase neutral species of the sample constituents and the electrons of the electron beam 166.

The ion source 120 also generates an electric field within the ionization region 164 (illustrated in FIG. 1 by equipotential contours 168) by applying voltage(s) to an extraction electrode 170, and/or a repeller electrode (not shown), and/or the electrodes positioned along a periphery of the ionization region 164. The sample ions formed within ionization region 164 respond to the electric field, and are accelerated out of the chamber of the ion source 120 through an output port 172.

The sample ions are extracted through the output port 172 and are transferred by the ion transfer chamber 130 to the entrance of the quadrupole mass analyzer 140.

The transmission efficiency and resolving power of the quadrupole mass analyzer 140 depends on the characteristics of the beam of sample ions entering the quadrupole mass analyzer 140 (e.g., the radial positions, angles, and/or kinetic energies of the sample ions as they enter the quadrupole mass analyzer 140). These ion beam characteristics are, in turn, limited by the ionization efficiency and emission characteristics of the ion source 120, in conjunction with limitations of the focusing properties of any ion transfer optics (e.g., DC electrode lenses) used in the system 100.

To improve these characteristics, in some cases, the ion transfer chamber 130 can include an ion guide 174 that generates a radio frequency (RF) field in the ion transfer chamber 130. In some cases, the ion transfer chamber 130 can also generate an axial electric field (e.g., an electric field extending along the direction of the path of travel of the sample ion beam). As sample ions travel through the ion transfer chamber 130, only ions of a certain m/z ratio or range of /z ratios will reach the next stage. Other ions have unstable trajectories and will collide with the ion guide 174. This permits selection of an ion with a particular m/z ratio or range of m/z ratios.

In some cases, the ion transfer chamber 130 can be pressurized with a gas. For example, sample ions exiting the ion source can be passed into a pressurized ion transfer chamber 130, and can be constrained by the RF field to oscillate about an ion guide axis 176 as they traverse the length of the ion transfer chamber 130. Collisions with the gas molecules dissipate the sample ions' kinetic energy, resulting in a reduction of their radial excursion and kinetic energies. Due to the dissipation of kinetic energy, upon reaching the exit 178 of the ion transfer chamber 130, the sample ions are focused into the entrance of the quadrupole mass analyzer 140 with improved beam characteristics (e.g., less variation in radial positions and angles, and with lower kinetic energy), allowing greater ion transmission and/or resolving power by the mass analyzer, than with conventional electrostatic optics. This can also be beneficial, for example, as it improves the transmission efficiency for initially broad spatial and angular ion distributions, such as produced from the ion source 120.

The focused ion beam at the exit 178 of the ion transfer chamber 130 is injected into the entrance of a quadrupole mass analyzer 140 for mass analysis of the sample ions.

For instance, the quadrupole mass analyzer can mass resolve the sample ions based on their mass-to charge ratios (m/z). As an example, the quadrupole mass analyzer 140 can include four parallel electrically conductive rods arranged in a 2×2 configuration, with each opposing rod pair is connected together electrically. A RF voltage with a DC offset voltage can be applied between one pair of rods and the other. As sample ions travel down the quadrupole mass analyzer, only ions of a certain mass-to-charge ratio will reach the detector for a given ratio of voltages. Other ions have unstable trajectories and will collide with the rods. This permits selection of an ion with a particular m/z ratio. The mass-resolved ions are subsequently detected by an ion detector. The output signal from the ion detector is processed by the control module 150, where signal intensity of ions of the transmitted m/z ratio are recorded.

In addition to processing output signals from the ion detector, the control module 150 can also control the operation of some or all of the other components of the system 100. For example, in some cases, the control module 150 can be communicatively coupled to the ion source 120, the ion transfer chamber 130, and/or the quadrupole mass analyzer 140, and provide instructions or commands to each component to regulate their performance. In some cases, the control module 150 can be implemented, at least in part, using one or more computing devices (e.g., one or more electronic processing devices, each have one or more microprocessors, such as personal computers, smartphones, tablet computers, server computers, etc.).

In some cases, an ion source can include a magnetic field generator configured to generate a magnetic field in a direction parallel to a direction of the electron beam and coincident with the electron beam. This can be useful, for example, as it causes the electrons of the electron beam to travel in a helical direction about the direction of the electron beam. This lengthens the path of each electron within the ion source chamber, and increases the likelihood that each electron will interact with and ionize the sampled constituents. As a result, the ionization efficiency of the ion source is improved.

Figure 2:
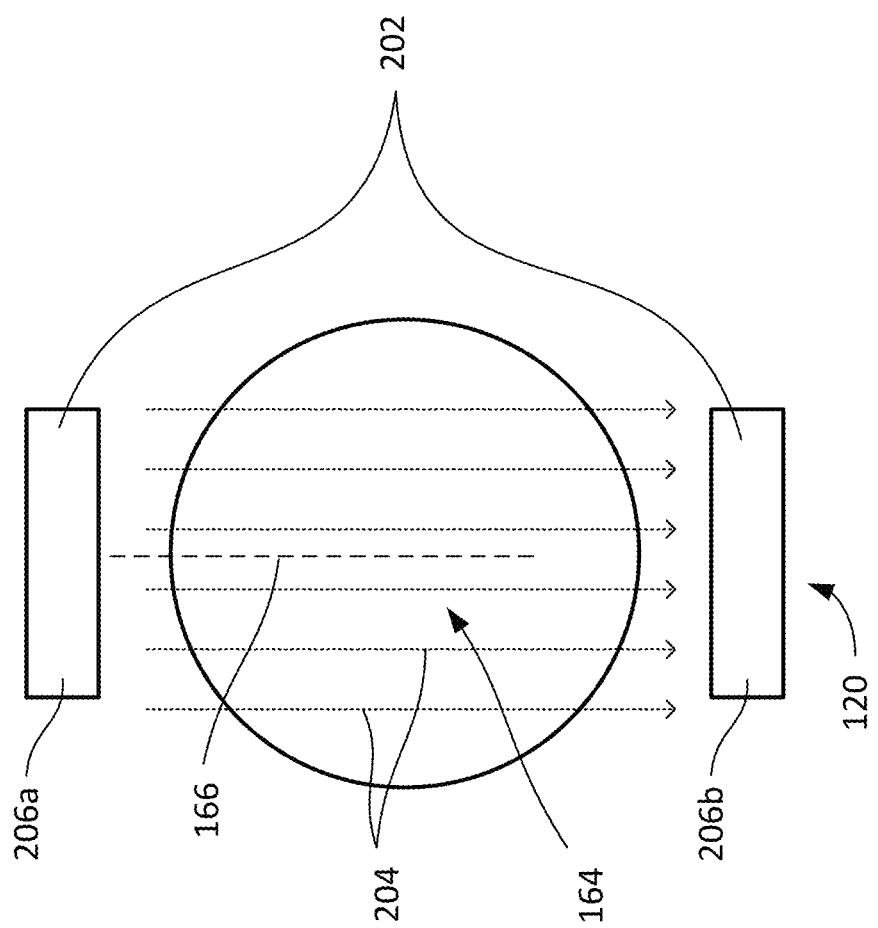
FIG. 2 is a cross-sectional diagram of example ion source.

For example, FIG. 2 shows a simplified cross-sectional view of the ion source 120. As described above, the ion source 120 can generate an electron beam 166 through the ionization region 164 of the ion source 120, causing a portion of the eluting constituents within the ionization region 164 to be ionized by interaction with the electrons in the electron beam 166. In FIG. 2, the electron beam 166 is represented by a dotted vertical line.

The ion source 120 also includes a magnetic field generator 202 configured to generate a magnetic field 204 within the ionization region 164 (represented by dotted vertical lines). In some cases, the magnetic field generator 202 can include two magnets 206a and 206b (e.g., permanent magnets) positioned on opposite ends of the electron beam 166, and aligned in the direction parallel to the direction of the electron beam 166.

As shown in FIG. 2, the magnetic field 204 is generated in a direction parallel to the direction of the electron beam 166 and coincident with the electron beam 166. This causes the electrons of the electron beam 166 to travel in a helical direction about the direction of the electron beam 166, thereby lengthening the path of each electron within the ionization region 164, and increasing the likelihood that each electron will interact with and ionize the sampled constituents within the ionization region 164.

However, this magnetic field can also influence the path of ionized sample constituents as they pass through and exit the ion source. For example, the magnetic field can impart a Lorentz force on the ionized sample constituents in a direction orthogonal to their direction of travel, causing them to deviate from their path. As a result, the ionized sample constituents may exit the ion source 120 along a bent path and/or in a non-uniform or scattered manner, thereby negatively impacting the performance of the mass analyzer. Further, in some cases, the ionized sample constituents can collide with the chamber walls of the ion source chamber, and might not exit the ion source at all.

Figure 3A:
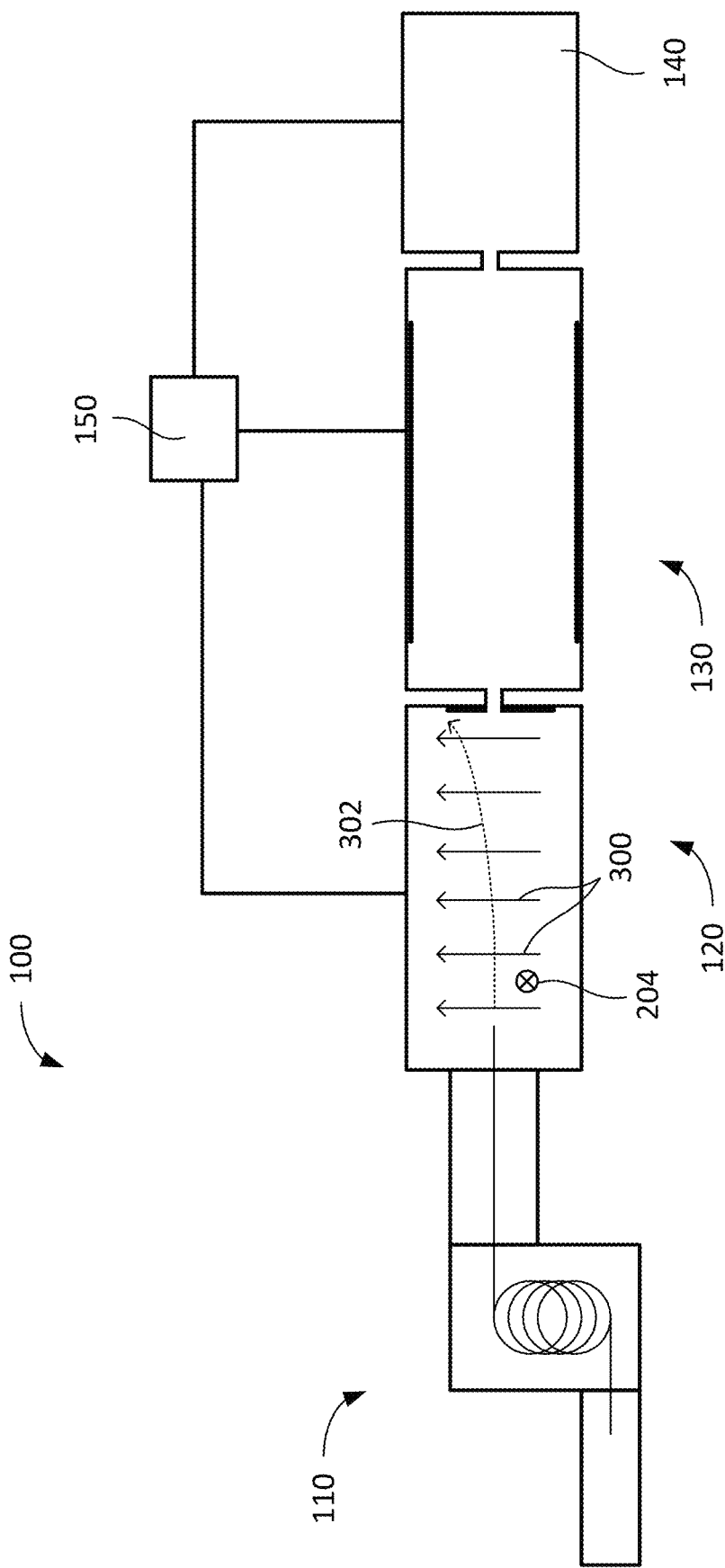
FIG. 3A is a schematic diagram showing an effect of an example magnetic field on ionized sample constituents in an GC/MS system.

For example, as shown in FIG. 3A, the magnetic field 204 in generated in a direction parallel to a direction of the electron beam and orthogonal to the path of the eluted sample constituents. The magnetic field 204 is represented by a cross, indicating that the direction of the magnetic field 204 is into the page.

Further, the force F acting on a particle of electric charge q with instantaneous velocity v, due to an external electric field E and magnetic field B, is given by (in SI units):

$$F=q(E+v\times B)$$

where × is the vector cross product.

As the ionized sample constituents are positively charged particles, force 300 (represented by vertically aligned arrows in an upward direction) is imparted on the ionized sample constituents a direction orthogonal to their direction of travel, causing them to deviate from their path. As a result, the sample constituents traverse a curved or bent path 302, instead of a straight path through the ion source 120. Accordingly, the ionized sample constituents may exit the ion source 120 in a non-uniform or scattered manner, thereby negatively impacting the performance of the mass analyzer. Further, if the magnitude of the magnetic field B is sufficiently large, the path 302 of the ionized sample constituents may deviate to such a degree that the ionized sample constituents collide with the chamber walls of the ion source 120, thereby preventing them from exiting the ion source 120.

To reduce or eliminate the effect of the magnetic field on the ionized sample constituents, an ion source chamber can include an electric field generator to compensate for this effect. As an example, the electric field generator can be configured to generate an electric field within the ion source chamber, such that an additional force is imparted on the ionized sample constituents. The force imparted on the ionized sample constituents by the electric field can be opposite in direction and substantially equal in magnitude to the force imparted on the ionized sample constituents by the magnetic field, such that the two forces substantially cancel one another. As a result, the ionized sample constituents are less likely to deviate or be scatted from their path, and thus exit the ion source chamber in a more focused manner.

Figure 3B:
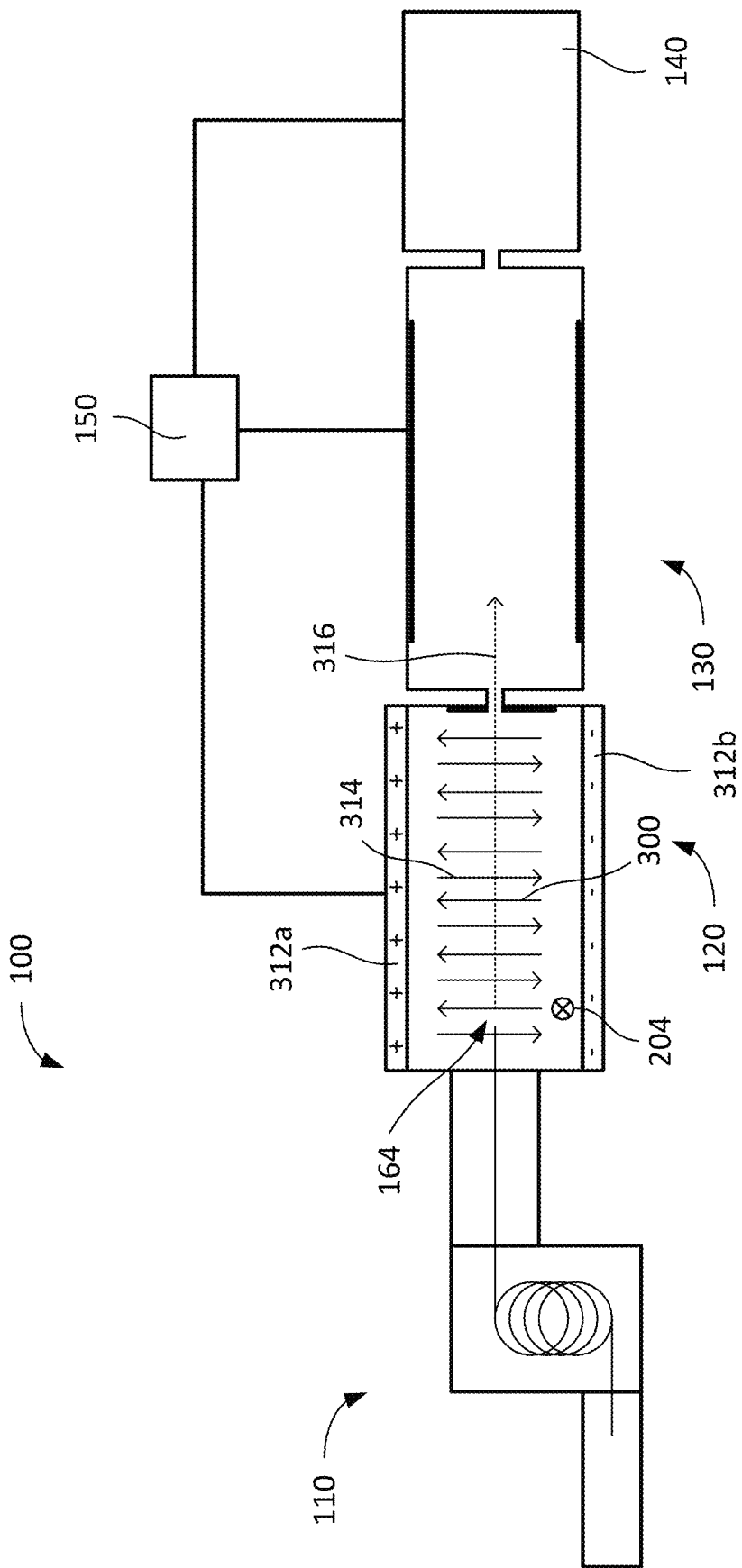
FIG. 3B is a schematic diagram showing an effect of an example compensation electric field on ionized sample constituents in an GC/MS system.

For example, as shown in FIG. 3B, the ion source 120 can include an electrical field generator 310. The electric field generator 310 includes one or more electrodes positioned with respect to the ionization region 164 such that, when an electric potential is applied to the electrodes, an electric field is generated within the chamber of the ion source 120. For instance, as shown in FIG. 3B, the electrical field generator 310 can include electrodes 312a and 312b positioned along a periphery of the ionization region 164. When an electrical potential is applied between the electrodes 312a and 312b (e.g., such that the electrode 312a has a higher electric potential than that the electrode 312b), an electric field is generated in a direction orthogonal to the direction of the magnetic field 204, and in a direction antiparallel to the force 300. As the ionized sample constituents are positively charged particles, force 314 (represented by vertically aligned arrows in a downward direction) is imparted on the ionized sample constituents a direction opposite the force 300.

The electric field generator 310 can be configured to selectively generate an electric field to compensate for the effects of the magnetic field on the ionized sample constituents. For example, based on the strength of the magnetic field 204, the electric field generator 310 can selectively apply a corresponding electrical potential to the electrodes 312a and 312b, such that the force 314 imparted on the ionized sample particles by the resulting electric field is equal or substantially equal in magnitude to the force 300 imparted by the magnetic field. For instance, given a particular charge q, velocity v, and magnetic field B, the electric field generator 310 can apply a corresponding electrical potential to the electrodes 312a and 312b to generate an electric field E, such that q(E+v×B) is equal to or substantially equal to zero. Accordingly, the ionized sample constituents are less likely to be scatted from their path, and exit the ion source chamber in a more focused manner (e.g., along a straight path 316 towards the ion transfer chamber 130 and/or the quadrupole mass analyzer 140).

In some cases, the electric field generator 310 can be configured to filter or isolate ionized sample constituents having a particular m/z ratio or range of m/z ratios from ionized sample constituents having a different m/z ratio or range of m/z ratios.

For example, as discussed above, the force F acting on a particle of electric charge q with instantaneous velocity v, due to an external electric field E and magnetic field B, is given by (in SI units):

$$F = q(E + v \times B)$$

Further, the force F acting on an object is equal to the mass of the object m times its acceleration a:

$$F = ma$$

Thus, the acceleration experienced by an ionized sample constituent a can be expressed as:

$$a = \frac{q(E + v \times B)}{m}$$

Notably, the acceleration a depends on both the charge of the ionized sample constituent q (or alternatively, z) and the mass of the ionized sample constituent m. Thus, each of the ionized sample constituents may be accelerated differently, depending on their respective m/z ratios.

To isolate or filter a particular type of ionized sample constituents, the electric field generator 310 can be configured to generate an electric field specific to those ionized sample constituents. For example, if an ionized sample constituent of interest has an m/z ratio of $m_1/z_1$, the electric field generator 310 can generate an electric field $E_1$ such that $$\frac{z_1(E_1 + v \times B)}{m_1} = 0$$

Accordingly, the ionized sample constituent of interest experience a net zero acceleration and/or net zero force due to the combined effects of the magnetic field and the electric field, and exit from the ion source 120 along a straight path.

However, ionized sample constituents having an m/z ratio different than $m_1/z_1$ experience a non-zero acceleration and/or non-zero force due to the combined effects of the magnetic field and the electric field. Thus, they may be accelerated away from the straight path of the ionized sample constituents of interest. Thus, the ionized sample constituents of interest can be physically isolated from other ionized sample constituents.

This permits selection of an ion with a particular m/z ratio or range of m/z ratios. For example, the ionized sample constituents of interest can be transferred to the quadrupole mass analyzer 140 for analysis, while some or all of the other ionized sample constituents can be collected and removed.

The electric field generator 310 can selectively apply different electric fields E to filter or isolate different ionized sample constituents of interest. For example, the electric field generator 310 can selectively apply a first electric field $E_1$ to filter or isolate a first ionized sample constituents of interest (e.g., having a first m/z ratio). Subsequently, the electric field generator 310 can selectively apply a second electric field $E_2$ to filter or isolate a second ionized sample constituents of interest (e.g., having a second different m/z ratio). Thus, the electric field generator 310 can vary the properties of the generated electric field to suit each particular application.

In some cases, the electric field generator 310 can be controlled, at least in part, by a user. For instance, in some cases, a user can specify the particular electric field that should be applied (e.g., by providing instructions to the control module 150). In some cases, the electric field generator 310 can be controlled, at least in part, by the system 100 automatically. For instance, in some cases, the control module 150 can automatically specify the particular electric field that should be applied, without input from a user.

As discussed above, the electric field generator 310 can be configured to filter or isolate ionized sample constituents having a particular range of m/z ratios from ionized sample constituents having a different range of m/z ratios. This can be performed, for example, by selectively applying a particular electric field E, such that ionized sample constituents having an m/z ratio within a target range travel a straight or sufficiently straight path through the ion source 120 and reach the quadrupole mass analyzer 140. Further, ionized sample constituents having an m/z ratio outside of the target range are accelerated away from the straight path, and are less like to reach the quadrupole mass analyzer 140.

As discussed above, the ion transfer chamber 130 can include an ion guide 174 that generates a RF field in the ion transfer chamber 130, such that only ions of a certain m/z ratio will reach the next stage. Further, quadrupole mass analyzer 140 can also permits selection of an ion with a particular m/z through the application of RF voltages to electrically conductive rods. In some cases, the electric field generator 310, the ion transfer chamber 130, and/or quadrupole mass analyzer 140 can be configured to work in conjunction, such that the selection windows of the electric field generator 310, the ion transfer chamber 130, and/or the quadrupole mass analyzer 140 overlap. This can be beneficial, for example, as it enables each of these components to work in conjunction to select ionized sample constituents based on their m/z ratios.

As an example, given values $N_1 < N_2$, the ion transfer chamber 130 and/or the quadrupole mass analyzer 140 can be configured to select ionized sample constituents having an m/z ratio in a first range: $N_1 < m/z < N_2$. Further, the electric field generator 310 also can be configured to select ionized sample constituents having an m/z ratio in the same range: $N_1 < m/z < N_2$. In conjunction, these components enable selection of ionized sample constituents having an m/z ratio in the range: $N_1 < m/z < N_2$.

As another example, given values $N_1 < N_2 < N_3 < N_4$, the ion transfer chamber 130 and/or the quadrupole mass analyzer 140 can be configured to select ionized sample constituents having an m/z ratio in a first range: $N_1 < m/z < N_3$. Further, the electric field generator 310 can be configured to select ionized sample constituents having an m/z ratio in the same range: $N_2 < m/z < N_4$. In conjunction, these components enable selection of ionized sample constituents having an m/z ratio in the range: $N_2 < m/z < N_3$.

As another example, given values $N_1 < N_2 < N_3 < N_4$, t the ion transfer chamber 130 and/or the quadrupole mass analyzer 140 can be configured to select ionized sample constituents having an m/z ratio in a first range: $N_1 < m/z < N_4$. Further, the electric field generator 310 can be configured to select ionized sample constituents having an m/z ratio in the same range: $N_2 < m/z < N_3$. In conjunction, these components enable selection of ionized sample constituents having an m/z ratio in the range: $N_2 < m/z < N_3$.

As another example, given values $N_1 < N_2 < N_3 < N_4$, the ion transfer chamber 130 and/or the quadrupole mass analyzer 140 can be configured to select ionized sample constituents having an m/z ratio in a first range: $N_2 < m/z < N_3$. Further, the electric field generator 310 can be configured to select ionized sample constituents having an m/z ratio in the same range: $N_1 < m/z < N_4$. In conjunction, these components enable selection of ionized sample constituents having an m/z ratio in the range: $N_2 < m/z < N_3$.

Although example selection windows are described above, these are merely illustrative examples. In practice, any combination of selection windows can be used to select for ionized sample constituents within a particular range of m/z ratios.

As described above, an electric field generator can include one or more electrodes positioned with respect to the ionization region such that, when an electric potential is applied to the electrodes, an electric field is generated within the ionization region. In practice, the one or more electrodes can be arranged in different ways, depending on the implementation.

As an example, FIG. 4A shows a cross sectional view of an example ion source 120 (depicted from a similar perspective as in FIG. 3B), and FIG. 4B shows an example configuration of the ion source 120 with respect to the plane A. As shown in FIG. 4B, the ion source 120 includes two electrodes 402a and 402b positioned along a periphery of the ionization region 164. The electrodes 402a and 402b are separated by non-conductive gaps 404a and 404b. When an electric potential is applied between the electrodes 402a and 402b (e.g., when the electrode 402a has a higher electric potential than the electrode 402b), an electric field 406 (represented by vertically aligned arrows in a downward direction) is generated within the ionization region 164. In some cases, the electrode having the lower electric potential (e.g., electrode 402b) can be grounded.

FIG. 4C shows a cross-section view of another example configuration of the ion source 120 with respect to the plane A. As shown in FIG. 4C, the ion source 120 includes four electrodes 410a-d positioned along a periphery of the ionization region 164. The electrodes 410a-d are separated by non-conductive gaps 412a-d. When an electric potential is applied between the electrodes 410a and 410c (e.g., when the electrode 410a has a higher electric potential than the electrode 410c), an electric field 414 (represented by vertically aligned arrows in a downward direction) is generated within the ionization region 164. In some cases, the electrodes 410b and 410d can each have an electric potential between those of the electrodes 410a and 410c. In some cases, the electric potentials of the electrodes 410b and 410d can be the average of the electric potentials of the electrodes 410a and 410c.

FIG. 4D shows a cross-section view of another example configuration of the ion source 120 with respect to the plane A. As shown in FIG. 4D, the ion source 120 includes an electrode 420 positioned along a periphery of the ionization region 164. The ends of the electrode 420 are separated by a non-conductive gap 422. When an electric potential is applied to the electrode 420 (e.g., when the electrode 410a has a higher electric potential than the ambient environment), an electric field 424 (represented by vertically aligned arrows in a downward direction) is generated within the ionization region 164.

In the examples shown in FIGS. 4B-4D, the electrodes and non-conductive gaps are distributed along a periphery of the ionization region 164, and define, at least in part, a circular cross-sectional profile. For example, each of the electrodes and non-conductive gaps have an arc-like or annular cross section that, in combination, define at least a portion of a circular shape. However, these are merely illustrative examples. In practice, the electrodes and non-conductive gaps can define other cross-sectional shapes. For example, in some cases, the electrodes and non-conductive gaps can define, at least in part, a polygon, an ellipse, a circle, a hyperbola, a parabola, or a combination thereof.

FIG. 5 shows a cross-sectional view of an example ion source 120 and an example ion transfer chamber 130 (depicted from a similar perspective as in FIG. 3B). Further, FIG. 5 includes several traces 502, each representing the simulated trajectory of an ionized sample constituents through the ion source 120 and the ion transfer chamber 130. Here, the effects of a magnetic field within the ion source 120 are compensated using a corresponding electric field, such that the force imparted on the ionized sample constituents by the magnetic field is canceled by the force imparted on the ionized sample constituents by the electric field. Accordingly, the ionized sample constituents are focused into a beam, and are accelerated out of the ion source 120 along a straight path 504.

FIGS. 6A-6D show cross-sectional views of an example ion source 120, an example ion transfer chamber 130, and an example quadrupole mass analyzer 140 (depicted from a similar perspective as in FIG. 3B).

Figure 6A:
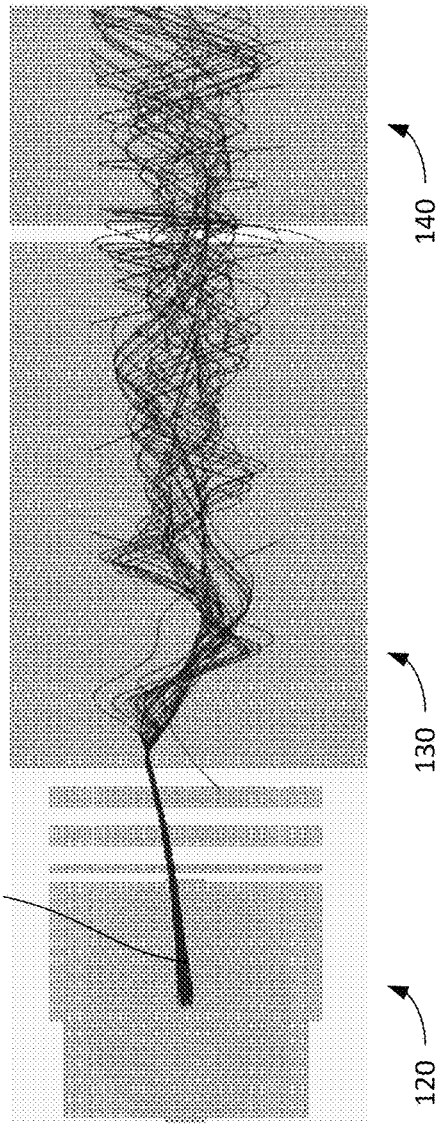

FIG. 6A includes several traces 602, each representing the simulated trajectory of an ionized sample constituents having an m/z ratio of 20 through the ion source 120, the ion transfer chamber 130, and the quadrupole mass analyzer 140. Here, the effects of a magnetic field within the ion source 120 are not compensated by a corresponding electric field. Thus, a net force is imparted on the ionized sample constituents by the magnetic field. Accordingly, the ionized sample constituents are exit the ion source 120 along a bent path, and are widely scattered in the ion transfer chamber 130 and the quadrupole mass analyzer 140.

Figure 6B:
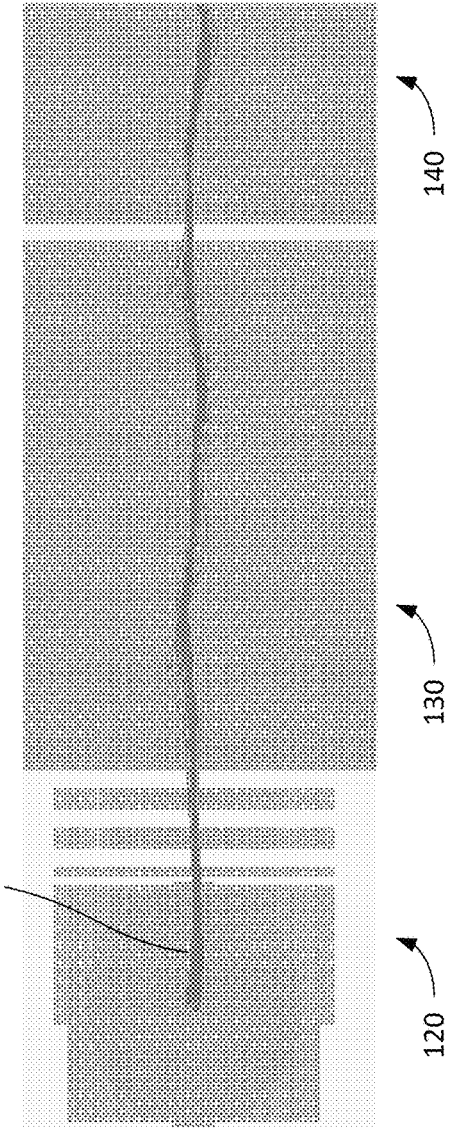

FIG. 6B includes several traces 604, each also representing the simulated trajectory of an ionized sample constituents having an m/z ratio of 20 through the ion source 120, the ion transfer chamber 130, and the quadrupole mass analyzer 140. Here, the effects of a magnetic field within the ion source 120 are compensated using a corresponding electric field, such that the force imparted on the ionized sample constituents by the magnetic field is canceled by the force imparted on the ionized sample constituents by the electric field. Accordingly, the ionized sample constituents are focused into a beam, and are accelerated out of the ion source 120 along a comparatively straighter path. Thus, the analytical performance of the system is improved.

FIG. 6C includes several traces 606, each representing the simulated trajectory of an ionized sample constituents having an m/z ratio of 1000 through the ion source 120, the ion transfer chamber 130, and the quadrupole mass analyzer 140. In a similar manner as described with respect to FIG. 6A, the effects of a magnetic field within the ion source 120 are not compensated by a corresponding electric field. Thus, a net force is imparted on the ionized sample constituents by the magnetic field. Accordingly, the ionized sample constituents are exit the ion source 120 along a bent path, and are widely scattered in the ion transfer chamber 130 and the quadrupole mass analyzer 140.

FIG. 6D includes several traces 608, each also representing the simulated trajectory of an ionized sample constituents having an m/z ratio of 100 through the ion source 120, the ion transfer chamber 130, and the quadrupole mass analyzer 140. In a similar manner as described with respect to FIG. 6B, the effects of a magnetic field within the ion source 120 are compensated using a corresponding electric field, such that the force imparted on the ionized sample constituents by the magnetic field is canceled by the force imparted on the ionized sample constituents by the electric field. Accordingly, the ionized sample constituents are focused into a beam, and are accelerated out of the ion source 120 along a comparatively straighter path. Thus, the analytical performance of the system is improved.

Figure 7A:
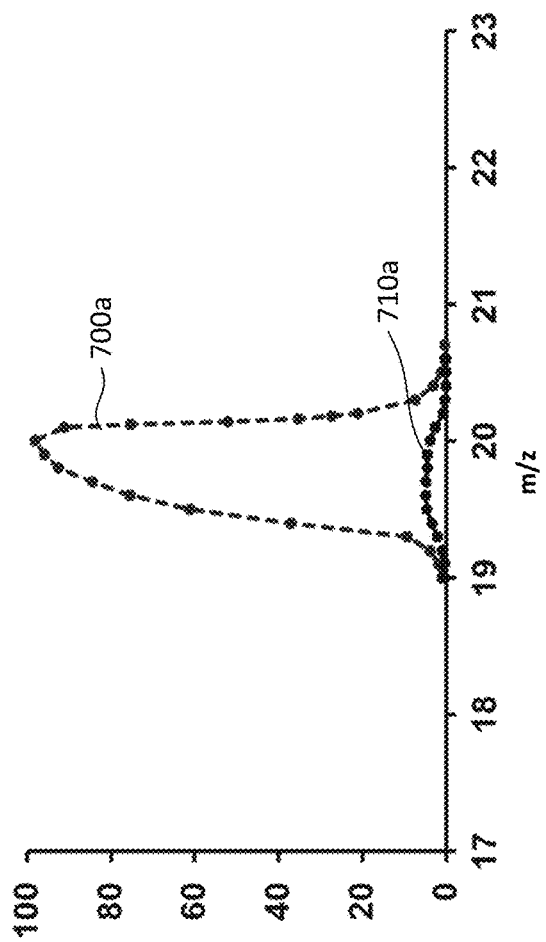
FIGS. 7A and 7B show the simulated performance of an example GC/MS system described herein, compared to the simulated performance of a conventional GC/MS system.
Figure 7B:
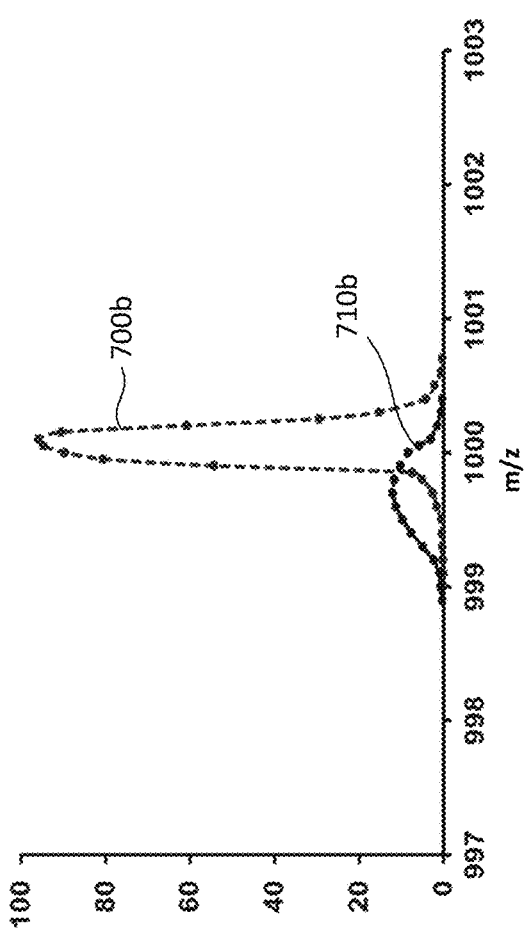

FIGS. 7A and 7B show the simulated performance of a GC/MS system described herein (e.g., having an ion source with an electric field generator to compensate for the effects of a magnetic field in the ion source), compared to the simulated performance of a conventional GC/MS system (e.g., having an ion source without the aforementioned electric field generator). In particular, FIGS. 7A and 7B show the simulated distribution of mass-resolved sample particles with respect to two different spectrums of m/z ratios for the improved GC/MS system (traces 700a and 700b) and the conventional GC/MS system (traces 710a and 710b).

As shown in FIGS. 7A and 7B, the distributions have two peaks, with a first peak spanning between approximately 19-20.8 m/z (as shown in FIG. 7A), and a second peak spanning between approximately 998.8 and 1000.4 m/z (as shown in FIG. 7B). As shown in FIG. 7A, the distribution is significantly more concentrated in the improved GC/MS system (e.g., trace 700a showing an approximately twenty-fold improvement in the lower m/z range versus trace 710a, and trace 700b showing an approximately 8-fold improvement in the higher m/z range versus trace 710b). Thus, the improved GC/MS system is significantly more effective at mass-resolving the sample particles, resulting in improved performance of the GC/MS system.

A number of embodiments have been described. Nevertheless, it will be understood that various modifications may be made without departing from the spirit and scope of the invention. Accordingly, other embodiments are within the scope of the claims.

What is claimed is:

1. A system comprising:
an ion source chamber comprising:
a first input port;
a second input port different from the first input port;
an exit port;
a magnetic field generator configured to generate a magnetic field within the ion source chamber;
a first electric field generator configured to generate a first electric field within the ion source chamber; and
a second electric field generator configured to generate a second electric field within the ion source chamber;
wherein the ion source chamber is configured, during operation, to:
receive gas-phase neutral species through the first input port;
receive a flow of electrons through the second input port;
guide the electrons through the ion source chamber using the magnetic field generator;
generate ions in an ionization region within the ion source chamber through an interaction between the gas-phase neutral species and the electrons; and
focus and accelerate at least some of the ions from the ion source chamber through the exit port along an ion beam axis using the first electric field generator;
wherein the second electric field generator is configured to reduce or eliminate an influence of the magnetic field on at least some of the ions accelerated from the ion source, and wherein a strength of the second electrical field is selected based on a strength of the magnetic field.

2. The system of claim 1, wherein the electrons flow in a first transverse direction within the ion source chamber, the first transverse direction being orthogonal to the ion beam axis, and
wherein the magnetic field generator is configured to generate the magnetic field in the first transverse direction and coincident with the flow of electrons.

3. The system of claim 2, wherein the magnetic field generator comprises at least two permanent magnets.

4. The system of claim 2, wherein the second electric field generator is configured to generate the second electric field in a second transverse direction, wherein the second transverse direction is orthogonal to the first transverse direction and orthogonal to the ion beam axis.

5. The system of claim 1, wherein focusing and accelerating at least some of the ions from the ion source chamber through the exit port comprises:
applying, to each ion of a first subset of ions having a first mass-to-charge (m/z) range, a first force using the first electric field generator to focus and accelerate the ions along the ion beam axis, whereby the first subset of ions experience a second force due to a motion of the first subset of ions in the magnetic field, the second force being orthogonal to both the ion beam axis and a direction of the magnetic field;
applying, to each ion of the first subset of ions, a third force using the second electric field generator; and
guiding the first subset of ions through the exit port,
wherein, for each ion of the first subset of ions, the third force and second force are opposite in direction and are substantially equal in magnitude, and wherein the strength of the second electrical field is selected further based on a velocity of the first subset of ions.

6. The system of claim 5, wherein focusing and accelerating at least some of the ions from the ion source chamber through the exit port comprises:
applying, to each ion of a second subset of ions having a second m/z range different than the first m/z range, a fourth force using the first electric field generator, whereby the second subset of ions experience a fifth force due to a motion of the second subset of ions in the magnetic field, the fifth force being orthogonal to both the ion beam axis and the direction of the magnetic field;
applying, to each ion of the second subset of ions, a sixth force using the second electric field generator, and
wherein, for each ion of the second subset of ions, a magnitude of the fifth force is different than a magnitude of the sixth force.

7. The system of claim 1, wherein the second electric field generator comprises a first electrode disposed along a periphery of the ionization region, and wherein the second electric field generator is configured to apply a first electric potential onto the first electrode to generate the second electric field.

8. The system of claim 7, wherein the second electric field generator further comprises a second electrode disposed opposite the first electrode along the periphery of the ionization region, and wherein the second electric field generator is configured to apply a second electric potential onto the second electrode to generate the second electric field.

9. The system of claim 8, further comprising one or more electrical elements disposed between the first electrode and the second electrode, wherein the second electric field generator is configured to apply a third electric potential onto the one or more electrical elements, wherein the third electric potential is an average of the first electric potential and the second electric potential.

10. The system of claim 8, wherein an inner contour of the first electrode and an inner contour of the second electrode define, at least in part, a cross-sectional shape, wherein the cross-sectional shape is one of a polygon, an ellipse, a circle, a hyperbola, or a parabola.

11. The system of claim 1, further comprising a mass analyzer, wherein the mass analyzer is configured to receive at least some of the ions from the ion source chamber through the exit port.

12. The system of claim 1, wherein the first electric field generator comprises an entrance electrode disposed proximate to the first input port, and wherein the first electric field generator is configured to apply an electric potential onto the entrance electrode to generate the first electric field.

13. The system of claim 1, wherein the first electric field generator comprises an exit electrode disposed proximate to the exit port, and wherein the first electric field generator is configured to apply an electric potential onto the exit electrode to generate the first electric field.

14. An ion source chamber of columnar geometry comprising:
   an entrance electrode assembly positioned at a first end of the chamber;
   an exit electrode assembly positioned at a second end of the chamber;
   a body electrode assembly positioned along an axis between the first end and the second end, encompassing a source volume where ions are generated;
   a first electric field generator configured to generate a first electric field in a first axial direction parallel to the axis within the ion source chamber to focus and accelerate at least some of the analyte ions from the ion source chamber through the exit port;
   a second electric field generator configured, during operation, to generate a second electric field in a first transverse direction perpendicular to the axis within the ion source chamber, whereby the influence of the magnetic field on the motion of ions having a first m/z range accelerated from the ion source is reduced or eliminated, wherein a strength of the second electrical field is selected based on a strength of the magnetic field;
   a first input port located on the entrance electrode assembly or body electrode assembly for importing electrons from the electron source;
   a second input port located on the entrance electrode assembly or body electrode assembly for importing at least one analyte;
   a magnet assembly configured for generating a dipolar magnetic field in a second transverse direction perpendicular to the axis and the first transverse direction;
   an electron source configured for generating an electron beam which passes through the ion source chamber in the second transverse direction coincident with the magnetic field with a portion of electron beam inside the chamber.

15. The ion source of claim 14, wherein an inner surface of the entrance electrode assembly is of a frusto-conical structure.

16. The ion source of claim 14, wherein the body electrode assembly is of hollow columnar structure, and
   wherein a cross-sectional shape of the body electrode on a transverse plane perpendicular to the axis is one of a circle, a hyperbola, a parabola, a polygon;
   wherein a cross-sectional shape of the body electrode on a transverse plane perpendicular to the axis is either axial symmetric or axial asymmetric.

17. A system comprising:
   a control module, which in real-time varies respective DC voltages supplied to the entrance electrode assembly, the exit electrode assembly, and the body electrode assembly, so that the first m/z range in claim 16 can be scanning across the full mass range during operation.

18. The system of claim 5, wherein the strength of the second electrical field is selected further based on m and z.

* * * * *